Feb. 2, 1971 J. A. FUCHS 3,560,879

LINEAR VOLTAGE CONTROLLED CRYSTAL OSCILLATORS

Filed March 12, 1969 2 Sheets-Sheet 1

INVENTOR
JAMES A. FUCHS

BY H. H. Losche

ATTORNEY

INVENTOR
JAMES A. FUCHS

BY H. H. Lossle

ATTORNEY

United States Patent Office 3,560,879
Patented Feb. 2, 1971

3,560,879
LINEAR VOLTAGE CONTROLLED CRYSTAL OSCILLATORS

James A. Fuchs, Palo Alto, Calif., assignor, by mesne assignments, to the United States of America as represented by the Secretary of the Navy Filed Mar. 12, 1969, Ser. No. 806,641
Int. Cl. H03b 5/36
U.S. Cl. 331—116 5 Claims

ABSTRACT OF THE DISCLOSURE

A linear voltage controlled crystal oscillator having an amplifier variable voltage feedback circuit with inductors, capacitors, and varactors producing a varactor network in series with a crystal and inductance network that provide circuit oscillation where the phase shift through the feedback circuit is zero, or at a frequency where the reactance of the inductance-capacitance network cancels the reactance of the crystal network, which varactor network is easy to align to provide a linear reactance-voltage relation.

BACKGROUND OF THE INVENTION

This invention relates to linear voltage controlled crystal oscillators with an output that is a linearly varying frequency controlled by a direct current (D.C.) slewing voltage.

The commonly used voltage controlled crystal oscillators can be separated into two parts, an amplifier and a D.C. variable voltage feedback network containing the crystal. This configuration is usually arranged so that oscillation occurs at a series resonance of the feedback circuit. Several types of feedback networks may be used to achieve a linear frequency versus D.C. voltage curve, but in the most used prior art varactor diodes are used as voltage variable capacitors together with a single crystal and an appropriate embedding network. Other techniques involving multiple crystals, diode shaping networks for the slewing voltages, or current variable inductances, are unsatisfactory from a practical standpoint because of the difficulty of alignment, or the temperature sensitivity, or the hysteresis effects, or the high current consumption.

SUMMARY OF THE INVENTION

In the present invention several embodiments are shown and described having novel arrangements of the varactor network in the feedback circuit of the oscillator amplifier that provide ease of alignment and low temperature sensitivity of linearity. In this invention two varactor diodes and two inductances are used in combination in a varactor network along with a D.C. blocking capacitor to approximate a linear reactance-voltage relation. This varactor network is in series with a parallel coupled crystal and inductance that are resonant at the oscillator frequency. A slewing D.C. voltage is applied as an input to the varactor network to cause the frequency of the oscillator output to change a slight amount. The inductance in the crystal-inductor parallel network is chosen to exactly cancel or neutralize the crystal's shunt capacity. The crystal can then be considered a series inductor-capacitor network in the small range of frequencies of interest, and in this range the reactance-frequency function of the neutralized crystal will be very linear. It is therefore a general object of this invention to provide a voltage controlled crystal oscillator circuit with a highly linear voltage relation to the reactance that is easy to align and with low temperature sensitivity affecting linearity.

BRIEF DESCRIPTION OF THE DRAWING

These and other objects and the attendant advantages, features, and uses will become more apparent to those skilled in the art as a more detailed description proceeds when taken in view of the accompanying drawing, in which.

DESCRIPTION OF THE PREFERRED EMBODIMENTS

Figure 1:
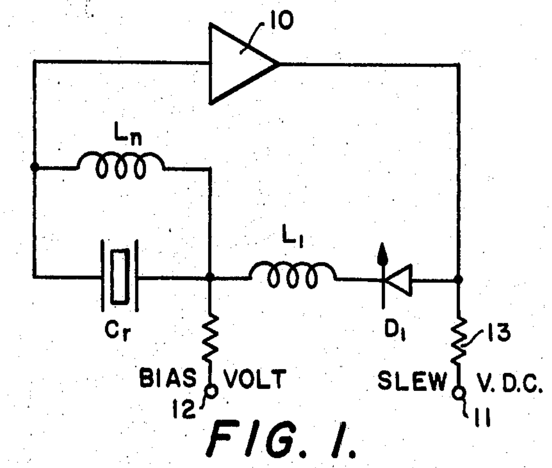
FIG. 1. (PRIOR ART)
FIG. 1 shows in partial circuit schematic and partial block diagram of a voltage controlled crystal oscillator known in the prior art.
Figure 2:
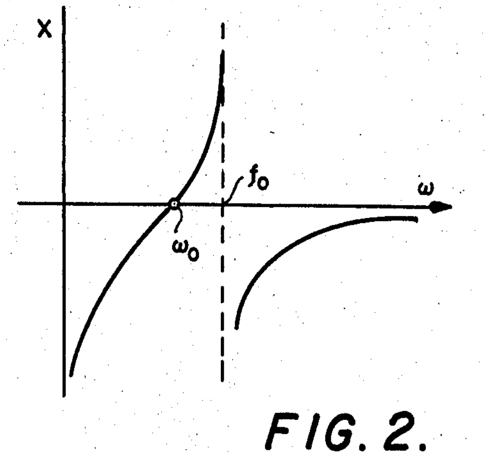
FIGS. 2, 3, and 4 illustrate reactance curves for the circuit of FIG. 1.
Figure 3:
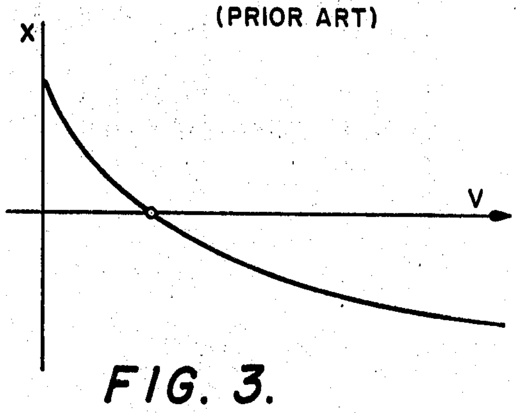

Referring to FIGS. 1, 2, and 3, there is illustrated a voltage controlled crystal oscillator of one known type consisting primarily of an amplifier 10 and a feedback circuit which includes a crystal network $C_r$, $L_n$ and a varactor network $D_1$, $L_1$. A D.C. voltage is applied to the feedback circuit from a terminal 11 through a resistor 13 to slew the oscillator frequency, and a bias voltage is applied to the feedback at terminal 12. The crystal $C_r$ and its pole-zero condition are illustrated in FIG. 2 where the reactance, positive and negative, are illustrated with respect to the frequency in radians where $\omega=2\pi f$. The varactor diode $D_1$ has a capacitance-voltage relation of $D_1=k./V^a$ where $k$ is a constant and $1/3\leq\alpha\leq1/2$. The reactance versus voltage of the series $D_1$, $L_1$ network in FIG. 1 is:

$$X=\frac{\omega^2kL_1-V^{1/2}}{\omega k}$$

and FIG. 3 illustrates the reactance-voltage curve. The circuit of FIG. 1 oscillates at the frequency where the phase shift through the feedback circuit is zero; that is, at the frequency where the reactance of the varactor network $D_1$, $L_1$ cancels the reactance of the crystal network $C_r$, $L_n$. Both the reactance-voltage function of the $D_1$, $L_1$ network and the reactance-frequency curce of the $C_r$, $L_n$ network are highly nonlinear, but a properly selected inductor, $L_n$ placed across the crystal, $C_r$, can yield a a feedback circuit whose zero reactance point, and therefore the oscillation frequency, versus voltage is highly linear. When $L_n$ is correctly chosen, the reactance of the $C_r$, $L_n$ network will have a fast rate of change as a function of frequency at those negative reactances where the $D_1$, $L_1$ network has a slow rate of change as a function of voltage, and vice versa. Thus a linear oscillation frequency versus voltage function is nearly obtained.

Figure 4:
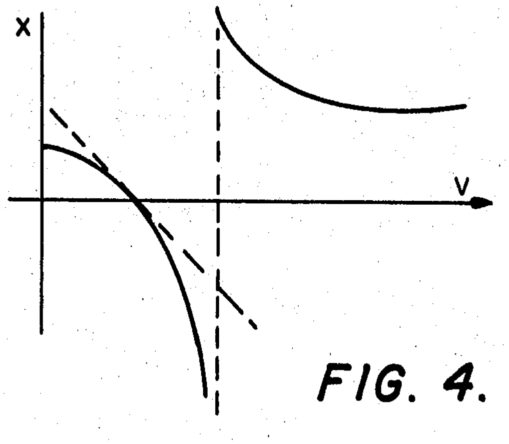
Figure 5:
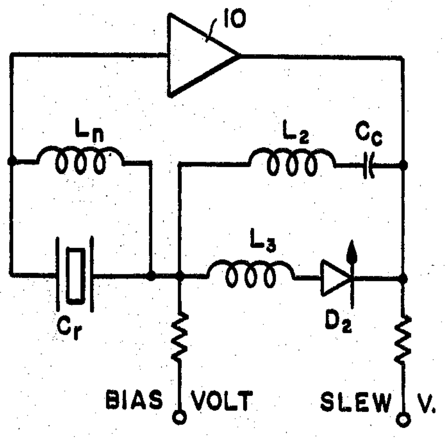
FIG. 5. (PRIOR ART)
FIGS. 5 and 6 illustrate prior art voltage controlled crystal oscillator circuits.
Figure 6:
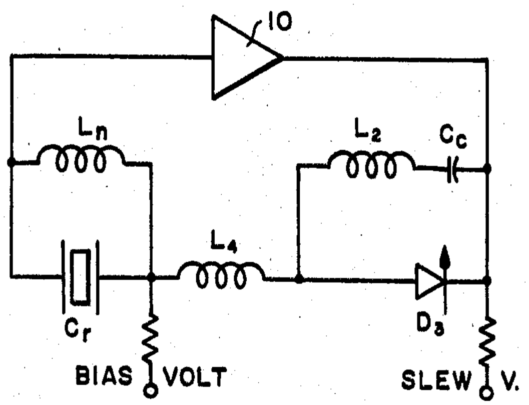
FIG. 6. (PRIOR ART)

Referring more particularly to FIGS. 4, 5, and 6 a second type of prior art voltage controlled oscillators is diagrammed in FIGS. 5 and 6. In these two figures the inductor, $L_n$, is chosen to exactly cancel or neutralize the reactance of the crystal's, $C_r$, shunt capacity. The crystal network can then be considered to be a series L-C circuit in the small range of frequencies of interest, and in this range the reactance-frequency function of the neutralized crystal will be very linear. This may be shown by the following equations:

$$X=2\pi fL-\frac{1}{2\pi fC}$$

Let, $\omega=2\pi f$ $$X=\omega L_0-\frac{1}{\omega C_0}$$

The slope of the reactance is:

$$M=\frac{dx}{d\omega}=L_0+\frac{1}{\omega^2 C_0}$$

The deviation of the slope from a straight line (constant slope) can be determined from the second derivative:

$$\frac{dM}{d\omega}=-\frac{2}{\omega^3 C_0}\approx\frac{\Delta M}{\Delta\omega}$$

or;

$$\Delta M=-\frac{2}{\omega^2 C_0}\frac{\Delta\omega}{\omega}$$

Now at series resonance $$L_0=\frac{2}{\omega_0^2 C_0}$$

Therefore, $$M=\frac{2}{\omega_0^2 C_0}=2L_0$$

and, $$\frac{\Delta M}{M}=-\frac{\Delta\omega}{\omega_0}=\frac{\Delta f}{f_0}$$

Thus, if the slewing voltage is varied to slew the oscillator frequency 1%, the slope of the crystal's reactance-frequency curve will change only 1% over this frequency range.

Maintaining the crystal network linear, efforts are directed toward developing a varactor network whose reactance versus voltage curve is linear. The prior art circuits of FIGS. 5 and 6 approximate this linear condition. The capacitor, $C_c$, in the varactor network, $L_2$, $L_3$, ($L_4$), $D_2$, ($D_3$), $C_c$ is selected to have a very small reactance at the oscillator frequency. Considering the varactor networks alone, the following reactance equation is used:

$$X=\omega\left[\frac{AV^{\alpha}-\omega^2 B}{V^{\alpha}-\omega^2 C}\right]$$

where A, B, C depend on the circuit configuration and the desired sensitivity of the overall circuit. FIG. 4 is a reactance-voltage plot for a fixed frequency, but in the actual oscillator where frequency changes only 1%–2% and reactance may change a large factor, the plot is still valid. Proper choice of circuit components will make the actual reactance curve tangent to the desired curve at the mid range where the dashed line meets the curved line in FIG. 4.

The voltage controlled crystal oscillator of FIG. 1 using the means above to improve linearity can be constructed but has several disadvantages. This circuit is difficult and time consuming to align since the $C_r$, $L_n$ reactance must be adjusted very precisely to complement the varactor curve. This adjustment is difficult since the proximity of the series and parallel resonances of the crystal make for a very sensitive network. This reactance sensitivity also makes the circuit's slewing linearity highly temperature sensitive.

The circuits of FIGS. 5 and 6 avoid some of the difficulties of FIG. 1 but are easy to align, the value of $L_n$ is not critical, and the temperature sensitivity of the linearity is low. However, these circuits have two deficiencies; the designer has no control over linearity and impractically large inductor values may often result. Since the desired straight line is being approximated essentially by a second order curve, the actual linearity may deviate substantially from the straight line.

In the present invention, as illustrated in the several embodiments by FIGS. 7 through 12, the advantages of ease of alignment and low temperature sensitivity of linearity, as described above for FIGS. 5 and 6, are retained and the designer has full control over the linearity of the circuit. FIGS. 7 through 10 illustrate four different embodiments in the feedback circuits which may be used in a linear voltage controlled crystal oscillator.

Figure 7:
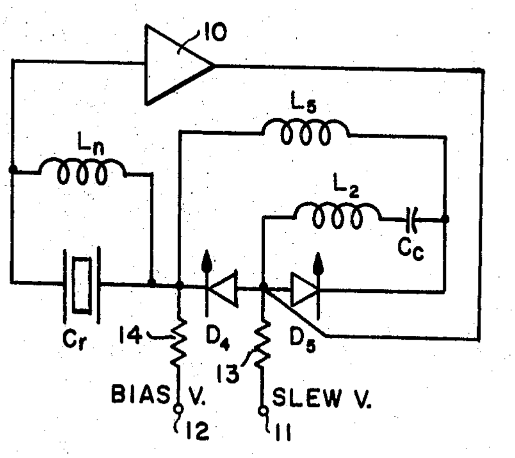
FIGS. 7, 8, 9, and 10 are partially schematic and partially block diagrams of four embodiments of linear voltage controlled crystal oscillators in accordance with this invention.

FIG. 7 shows the varactor network of the feedback circuit with the input—being the amplifier 10 output—coupled in common to the anodes of $D_4$ and $D_5$, one terminal of $L_2$ and one terminal of resistor 13 through which is applied the slewing voltage 11. The output of the varactor network is taken from the cathode of $D_4$ which is connected in common with a terminal of inductor $L_5$ and resistor 14 through which is connected bias voltage 12. The remaining terminal of inductor $L_5$ is connected in common with a terminal of coupling capacitor $C_c$ and the cathode of $D_5$. The remaining terminal of $C_c$ is connected to the remaining terminal of $L_2$.

Figure 8:
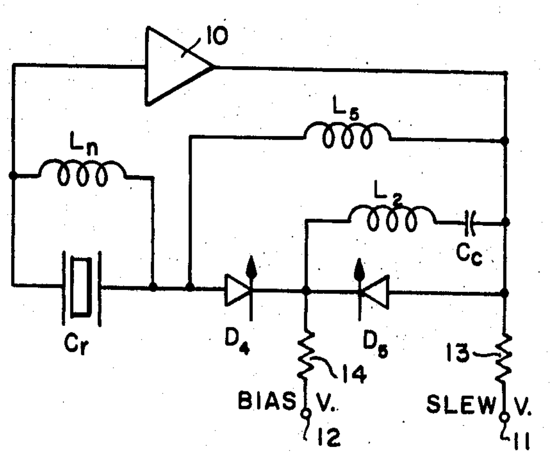

FIG. 8, with like parts in FIG. 7 having the same reference characters, differs from FIG. 7 in that the amplifier 10 output, being the varactor network input, is the common connection of the anode of $D_5$ and one terminal of $L_5$ and $C_c$.

Figure 9:
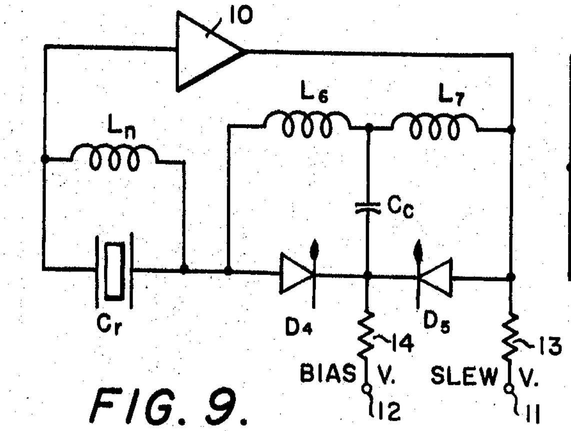

FIG. 9, shows the embodiment with an inductor $L_6$ in parallel with the varactor diode $D_4$ and an inductor $L_7$ in parallel with the varactor diode $D_5$, the D.C. blocking capacitor $C_c$ being in the coupling between the commonly coupled varactor diode cathodes and the commonly coupled terminals of the inductors $L_6$ and $L_7$.

Figure 10:
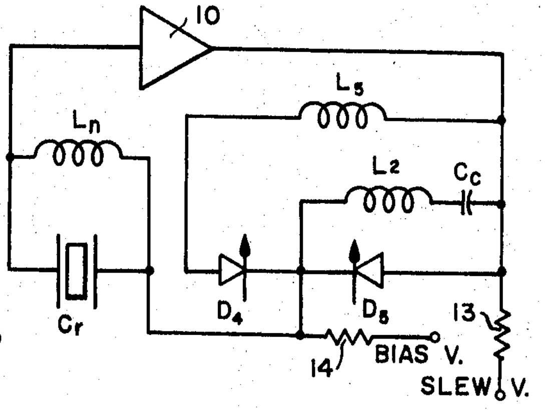

FIG. 10 is similar to FIG. 8 except that the output of the varactor network is taken from the common varactor diode cathode connection at the voltage biasing point. In all the FIGS. 7 through 10 the blocking capacitor $C_c$ has a very low reactance at the oscillator frequency.

Figure 11:
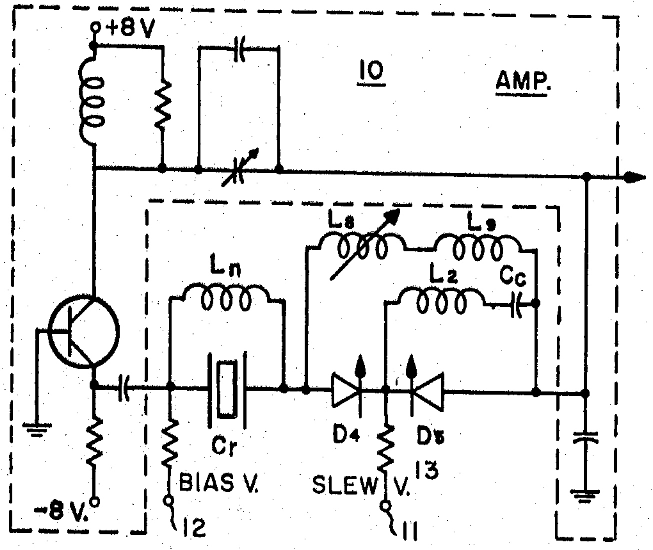
FIG. 11 is a circuit schematic diagram of a linear voltage controlled crystal oscillator coupled to an amplifier circuit in accordance with this invention.

Referring more particularly to FIG. 11 there is illustrated a circuit schematic of the amplifier 10 and the varactor and crystal networks in the feedback circuit. The crystal $C_r$ is completely neutralized, or when the reactance of the inductor $L_n$ exactly cancels the reactance of the crystal $C_r$, and it behaves as a series circuit. In the varactor network the varactor diodes $D_4$ and $D_5$ are oriented as in FIG. 8 with the inductor $L_2$ and the capacitor $C_c$ in the same relative position. An adjustable inductor $L_8$ and a fixed inductor $L_9$ in series are coupled across the varactor diodes. The slewing voltage applied to terminal 11 is connected to the common cathode coupling of the varactor diodes, as in FIG. 7. In this FIG. 11, $L_8$ may be 8–12 microhenrys ($\mu$h), $L_9$=15 $\mu$h, $C_c$=.01 microfarads ($\mu$f), resistor 13=51K ohms, and the varactor diode $D_4$ may be type IN1542, and varactor diodes $D_5$ may be type IN1544 for one operative example of feedback for the amplifier 10.

The reactance expression for the varactor networks in FIGS. 7 through 10 is:

$$X=\left[\frac{RV^{2\alpha}-\omega^2 SV^{\alpha}}{V^{2\alpha}-\omega^2 TV^{\alpha}+\omega^4 U}\right]\omega$$

Figure 12:
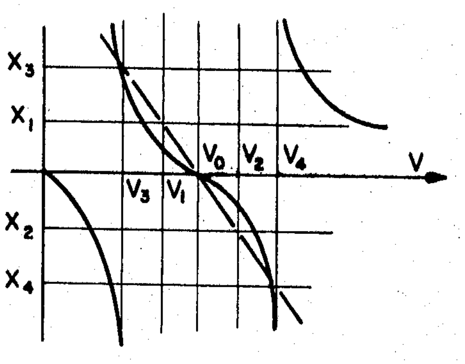
FIG. 12 is a reactance-voltage curve illustrating the results obtainable in the circuits of FIGS. 7 through 10.

The constants R, S, T, and U depend on the particular circuit, the sensitivity, the linearity, and the frequency. FIG. 12 is a reactance versus voltage diagram with a straight dashed line showing the desired linear function of the feedback circuit for the oscillator. The curved line overlying the dashed line is essentially approximated by a cubic function. The four feedback circuits (FIGS. 7–10) may approximate a straight line to an arbitrary accuracy but it remains to determine the constants R, S, T, U for a specified linearity and sensitivity and to synthesize the desired networks. To find the four constants, a system of four equations must be solved. Two equations are obtained by forcing the reactance equation to fit the desired reactance equation at the end point voltages, $V_3$ and $V_4$ as seen in FIG. 12. Using the equations derived above for neutralized crystal sensitivity, the following equations are developed:

$$X_3=4\pi L_0 S(V_0-V_3)$$
$$X_4=4\pi L_0 S(V_0-V_4)$$

where;

$L_0$=crystal series inductance in henrys

S=oscillator slewing sensitivity in hertz per volt.

Two more equations can be obtained by forcing the reactance equation to have its maximum deviation from the desired curve at the voltages $V_1$ and $V_2$. $V_1$ and $V_2$ are half way between $V_3-V_0$ and $V_0-V_4$, respectively. Let, $$X_1=4\pi L_0 S(V_0-V_1)(1-l/2)$$
$$X_2=4\pi L_0 S(V_0-V_2)(1-l/2)$$

where;

$l$=desired decimal linearity.

The factor 1/2 is included as a "safety factor." The factor $(1-l/2)$ forces the reactance at $V_1$ and $V_2$ to deviate from the desired straight line by a factor of $l/2$. The system of four equations may now be expressed as:

$$X_i=\omega_0\left[\frac{RV_i^{2\alpha}-\omega_0^2SV_i^{\alpha}}{V_i^{2\alpha}-\omega_0^2TV_i^{\alpha}+\omega_0^4U}\right]$$

where;

$i$=1 to 4

$\omega_0$=radian oscillator frequency at center of voltage range, $V_0$ $\alpha$=diode junction factor These equations may be solved for R, S, T, U when $\omega_0$ and $\alpha$ are given which solution is feasible on a digital computer. With the solution of R, S, T, & U the varactor networks can be synthesized. In the complex plane the reactance equation above has the impedance function:

$$Z(p)=K\left[\frac{p^3+A_p}{p^4+B_p^2+C}\right]V=V_0$$

where $$K=S/U\omega_0^4V_0^{1/2}\quad B=\frac{T}{U}\omega_0^4V_0^{1/2}$$

$$A=R/S\omega_0^4V_0^{1/2}\quad C=\frac{1}{U}\omega_0^8V_0$$

The impedance function $Z(p)$ is synthesized in the standard Foster and Cauer forms to obtain the networks shown in the FIGS. 7 through 10. Other forms are possible at the expense of additional components. The parts values resulting from the synthesis are the following: Feedback circuit in FIG. 7:

$$D_4=1/K\quad L_5=\frac{K}{(B-A)}$$

$$D_5=\frac{(B-A)^2}{K(AB-A^2-C)}\quad L_2=K\left[\frac{AB-A^2-C}{C(B-A)}\right]$$

Feedback circuit in FIG. 8:

$$D_4=\frac{AB-C}{A^2K}\quad L_2=\left[\frac{KA(AB-C-A^2)}{(AB-C^2)}\right]$$

$$D_5=\frac{AB-C}{K(AB-C-A^2)}\quad L_5=\frac{KA}{C}$$

Feedback circuit in FIG. 9:

$$D_4=\frac{2\sqrt{B^2-4C}}{2KA-KB+K\sqrt{B^2-4C}}$$

$$D_5=\frac{2\sqrt{B^2-4C}}{KB+K\sqrt{B^2-4C}-2KA}$$

$$L_6=\frac{2KA-KB+K\sqrt{B^2-4C}}{(\sqrt{B^2-4C})(B-\sqrt{B^2-4C})}$$

$$L_7=\frac{KB+K\sqrt{B^2-4C}-2KA}{(\sqrt{B^2-4C})(B+\sqrt{B^2-4C})}$$

Feedback circuit in FIG. 10:

$$D_5=\frac{1}{K}\quad L_2=\frac{KA}{C}$$

$$D_4=\frac{AB-C-A^2}{KA^2}\quad L_5=\frac{KA}{AB-C-A^2}$$

Solution of the above equations have not been made herein since these solutions are of the nature to be completed by a computer. The computations are made as set forth in the text Network Analysis And Synthesis by Louis Weinberg, published by the McGraw-Hill Book Company, Inc., 1962, Chapter 9, where there is a complete discussion of the Foster and Cauer synthesis methods. The solution of the four equations related respectively to the varactor feedback circuits of FIGS. 7 through 10 will provide a linear function of the reactance relative to the slewing D.C. voltage applied.

While modifications and changes may be made in the constructional details and features of this invention and remain within the spirit of my invention, I desire to be limited in my invention only by the scope of the appended claims.

I claim:

1. A linear voltage controlled crystal oscillator circuit comprising:

an amplifier having an input and an output; and a feedback circuit including a varactor network and a crystal network coupled in series from the output to the input of said amplifier, said varactor network having a pair of varactor diodes in series, a pair of inductors paralleling said varactor diodes, and a blocking capacitor between said amplifier output and the juncture of said varactor diodes with variable slewing voltage and biasing voltage inputs coupled to said varactor network to provide a linear reactance with respect to said applied variable slewing voltage, and said crystal network having a crystal in parallel with an inductance with the inductive reactance thereof exactly canceling the capacitive reactance of said crystal to operate as a series inductance-capacitance network whereby the reactance of said feedback circuit is substantially linear in a predetermined frequency range.

2. A linear voltage controlled crystal oscillator circuit as set forth in claim 1 wherein said pair of varactor diodes have the anodes thereof coupled in common to said amplifier output and to said slewing voltage input, one of said pair of inductors and said blocking capacitor in series being coupled in parallel to one of said varactor diodes, the other of said pair of inductors being in parallel to said pair of varactor diodes, and the cathode of said other of said pair of varactor diodes being coupled to said biasing voltage and to said crystal network.

3. A linear voltage controlled crystal oscillator circuit as set forth in claim 1 wherein said pair of varactor diodes are in cathode-to-cathode coupled relation to said biasing source with one inductor and said blocking capacitor in series coupled in parallel with one of said varactor diodes and with the other inductor coupled in parallel to the series coupled varactor diodes, the slewing voltage and the amplifier output being coupled to the anode of said one varactor diode and the anode of the other varactor diode being coupled to said crystal network.

4. A linear voltage controlled crystal oscillator circuit as set forth in claim 1 wherein said pair of varactor diodes have their cathodes coupled in common to said bias voltage, said pair of inductors in series coupled in parallel to the anodes of said varactor diodes with the common coupling of said inductors and the common coupling of said varactor diodes coupled to opposite plates of said blocking capacitor, and said slewing voltage coupled with said amplifier output to the anode of one of said varactor diodes, and the anode of said other varactor diode being coupled to said crystal network.

5. A linear voltage controlled crystal oscillator circuit as set forth in claim 1 wherein said pair of varactor diodes have their cathodes coupled in common to said biasing source and to said crystal network, the anode of one coupled to said amplifier output and said slewing voltage, the anode of the other coupled through one of said pair of inductors to said amplifier output and said slewing voltage, and the other of said pair of inductors in series with said blocking capacitor coupled in paral- to said one varactor diode.

References Cited

UNITED STATES PATENTS

| | | | |
|---|---|---|---|
| 3,358,244 | 12/1967 | Ho et al. ------ | 331—177(V)X |
| 3,477,039 | 11/1969 | Chan -------------- | 331—116 |

JOHN KOMINSKI, Primary Examiner

S. H. GRIMM, Assistant Examiner

U.S. Cl. X.R.

331—158, 177

PO-1050
(5/69)

UNITED STATES PATENT OFFICE
CERTIFICATE OF CORRECTION
UNDER RULE 322

Patent No. 3,560,879 Dated 2 February 1971

Inventor(s) JAMES A. FUCHS

It is certified that error appears in the above-identified patent and that said Letters Patent are hereby corrected as shown below:

Column 3, line 19, change equation $$L_o = \frac{2}{\omega_o^2 C_o}$$

To read:

$$L_o = \frac{1}{\omega_o^2 C_o}$$

Signed and sealed this 3rd day of August 1971.

(SEAL)
Attest:

EDWARD M.FLETCHER,JR.
Attesting Officer

WILLIAM E. SCHUYLER, JR.
Commissioner of Patents